(12) United States Patent  
Oksanen et al.

(10) Patent No.: US 8,149,072 B2  
(45) Date of Patent: Apr. 3, 2012

(54) RESONATORS, RESONATOR ARRAYS, APPARATUS AND METHODS

(75) Inventors: Markku Anttoni Oksanen, Helsinki (FI); Ilkka Tittonen, Kirkkonummi (FI); Mika Petteri Koskenvuori, Espoo (FI)

(73) Assignee: Nokia Corporation, Espoo (FI)

( * ) Notice: Subject to any disclaimer, the term of this patent is extended or adjusted under 35 U.S.C. 154(b) by 299 days.

(21) Appl. No.: 12/470,855

(22) Filed: May 22, 2009

(65) Prior Publication Data

US 2010/0295632 A1    Nov. 25, 2010

(51) Int. Cl.
- *H03H 9/24* (2006.01)
- *H03H 9/46* (2006.01)
- *H03H 9/48* (2006.01)

(52) U.S. Cl. ..................... 333/186; 333/199

(58) Field of Classification Search ........ 333/186–189, 333/199; 257/414–416  
See application file for complete search history.

(56) References Cited

U.S. PATENT DOCUMENTS

| | | | |
|---|---|---|---|
| 6,856,217 B1 * | 2/2005 | Clark et al. | 333/186 |
| 2004/0207492 A1 * | 10/2004 | Nguyen et al. | 333/199 |
| 2007/0052498 A1 * | 3/2007 | Pan et al. | 333/186 |
| 2010/0024560 A1 * | 2/2010 | Shcheglov | 73/649 |
| 2010/0058861 A1 * | 3/2010 | Kuang et al. | 73/504.12 |
| 2010/0074445 A1 | 3/2010 | Nefedov et al. | |

FOREIGN PATENT DOCUMENTS

WO    2010/034728 A1    4/2010

OTHER PUBLICATIONS

M.U. Demirci et al.; "Single-Resonator Fourth-Order Micromechanical Disk Filters"; MEMS 2005, 18th IEEE International Conference on Micro Electro Mechanical Systems, Jan. 30-Feb. 3, 2005, pp. 207-210.*

S-S. Li et al.; "A Micromechanical Parallel-Class Disk-Array Filter"; 2007 IEEE International Frequency Control Symposium; May 29, 2007-Jun. 1, 2007, pp. 1356-1361.*

L. Yan et al.; "Piezoelectric Micromechanical Disk Resonators Towards UHF Band"; 2004 IEEE Ultrasonics Symposium, Aug. 23-27, 2004, pp. 926-929.*

P.J. Stephanou et al.; "Piezoelectric Aluminum Nitride MEMS Annular Dual Contour Mode Filter"; Sensors and Actuators A 134 (2007), pp. 152-160, available online Jun. 27, 2006.*

S-S. Li et al.; "Disk-Array Design for Suppression of Unwanted Modes in Micromechanical Composite-Array Filters"; IEEE MEMS 2006, Istanbul, Turkey, Jan. 22-26, 2006, pp. 866-869.*

"The Kuramoto model: A simple paradigm for synchronization phenomena," Reviews of Modern Physics, vol. 77, Juan A. Acebron et al., Jan. 2005, pp. 137-185.

"Synchronization of MEMS Resonators and Mechanical Neurocomputing," IEEE Transactions on Circuits and Systems—I: Fundamental Theory and Applications, vol. 48, No. 2, Frank C. Hoppensteadt et al., Feb. 2001, pp. 133-138.

"Two-dimensional array of coupled nanomechanical resonators," Applied Physics Letters 88, 143504, Maxium K. Zalalutdinov et al., 2006 (3 pages), published online Apr. 3, 2006.

* cited by examiner

*Primary Examiner* — Barbara Summons

(57) ABSTRACT

A resonator includes a substantially disk shaped portion having a plurality of axes of symmetry and is configured to resonate in a plurality of resonant modes by symmetrically deforming about the plurality of axes of symmetry.

22 Claims, 6 Drawing Sheets

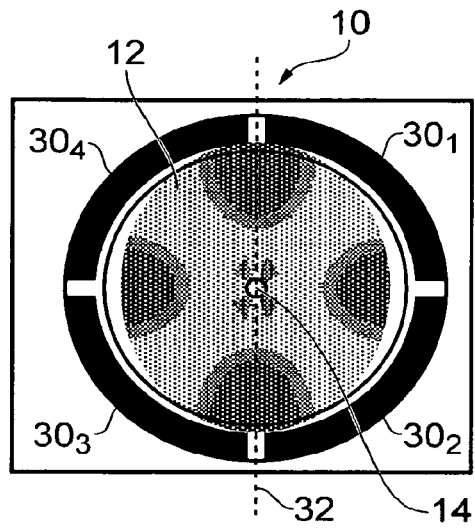
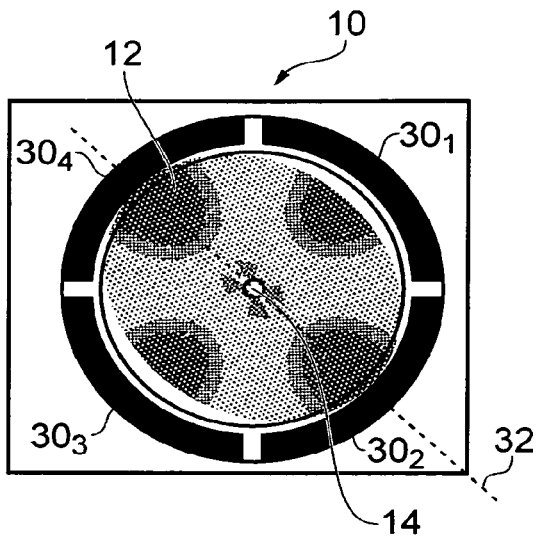
FIG. 4A    FIG. 4B
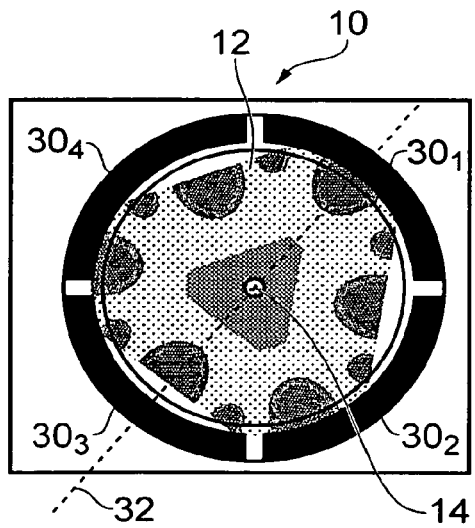
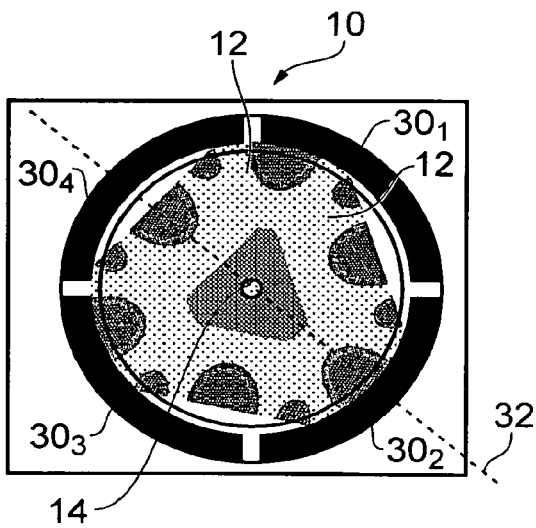
FIG. 5A    FIG. 5B

RESONATORS, RESONATOR ARRAYS, APPARATUS AND METHODS

FIELD OF THE INVENTION

Embodiments of the present invention relate to resonators, resonator arrays, apparatus and methods. In particular, they relate to resonators, resonator arrays, apparatus and methods in a mobile cellular telephone.

BACKGROUND TO THE INVENTION

Apparatus such as mobile cellular telephones may comprise one or more resonator arrays for signal processing purposes. The resonators in these resonator arrays may have a limited number of resonant modes (and spatial phases) which may restrict how they are arranged within the resonator array and how the resonator array is connected to other circuitry.

It would therefore be desirable to provide an alternative resonator array.

BRIEF DESCRIPTION OF VARIOUS EMBODIMENTS OF THE INVENTION

According to various, but not necessarily all, embodiments of the invention there is provided a resonator comprising: a substantially disk shaped portion having a plurality of axes of symmetry and configured to resonate in a plurality of resonant modes by symmetrically deforming about the plurality of axes of symmetry.

The disk shaped portion may be configured to symmetrically deform by bending about an axis of symmetry, the bending of the disk shaped portion being substantially the same either side of the axis of symmetry.

Each of the plurality of resonant modes may have a different orientation.

The disk shaped portion may have a volume that is substantially constant during resonance.

The disk shaped portion may be configured to resonate at a first frequency and at least one integer multiple of the first frequency. The resonator may further comprise a support portion configured to support the disk shaped portion.

The support portion may be connected to the centre of the disk shaped portion at the intersection of the plurality of axes of symmetry. Alternatively, the support portion may be connected at a position away from the centre of the disk shaped portion.

The resonator may be a micro-electro-mechanical system (MEMS). The resonator may be a nano-electro-mechanical system (NEMS).

According to various, but not necessarily all, embodiments of the invention there is provided a resonator comprising: a portion having a substantially circular cross section and a plurality of axes of symmetry and configured to resonate in a plurality of resonant modes by symmetrically deforming about the plurality of axes of symmetry.

According to various, but not necessarily all, embodiments of the invention there is provided a resonator comprising: a substantially planar portion having five or more axes of symmetry and configured to resonate in five or more resonant modes by symmetrically deforming about the five or more axes of symmetry.

According to various, but not necessarily all, embodiments of the invention there is provided a resonator array comprising a plurality of resonators as described in any of the preceding paragraphs.

At least a subset of neighboring resonators of the plurality of resonators of the resonator array may be electrostatically coupled to one another via a plurality of electrodes.

At least a subset of neighboring resonators of the plurality of resonators of the resonator array may be physically connected to one another via connectors.

According to various, but not necessarily all, embodiments of the invention there is provided a module comprising a resonator as described above or a resonator array as described above.

According to various, but not necessarily all, embodiments of the invention there is provided an apparatus comprising a resonator as described above or a resonator array as described above.

The apparatus may be for wireless communication.

According to various, but not necessarily all, embodiments of the invention there is provided a mobile cellular telephone comprising a resonator as described above or a resonator array as described above.

According to various, but not necessarily all, embodiments of the invention there is provided a method comprising: providing a resonator including a substantially disk shaped portion having a plurality of axes of symmetry; and configuring the disk shaped portion to resonate in a plurality of resonant modes by symmetrically deforming about the plurality of axes of symmetry.

Each of the plurality of resonant modes may have a different orientation. The disk shaped portion may have a volume that is substantially constant during resonance.

The method may further comprise configuring the disk shaped portion to resonate at a first frequency and at least one integer multiple of the first frequency.

The method may further comprise providing a support portion of the resonator configured to support the disk shaped portion.

The support portion may be connected to the centre of the disk shaped portion at the intersection of the plurality of axes of symmetry. Alternatively, the support portion may be connected at a position away from the centre of the disk shaped portion.

The resonator may be a micro-electro-mechanical system (MEMS). The resonator may be a nano-electro-mechanical system (NEMS).

According to various, but not necessarily all, embodiments of the invention there is provided a method comprising: providing a resonator array comprising a plurality of resonators as described above.

The method may further comprise providing a plurality of electrodes to electrostatically couple at least a subset of neighboring resonators of the plurality of resonators.

The method may further comprise providing a plurality of connectors to physically connect at least a subset of neighboring resonators of the plurality of resonators.

BRIEF DESCRIPTION OF THE DRAWINGS

For a better understanding of various examples of embodiments of the present invention reference will now be made by way of example only to the accompanying drawings in which:

FIGS. 4A and 4B illustrate deformation of a resonator in two resonant modes according to various embodiments of the invention;

FIGS. 5A and 5B illustrate deformation of a resonator in a further two resonant modes according to various embodiments of the invention;

DETAILED DESCRIPTION OF VARIOUS EMBODIMENTS OF THE INVENTION

Figure 1:
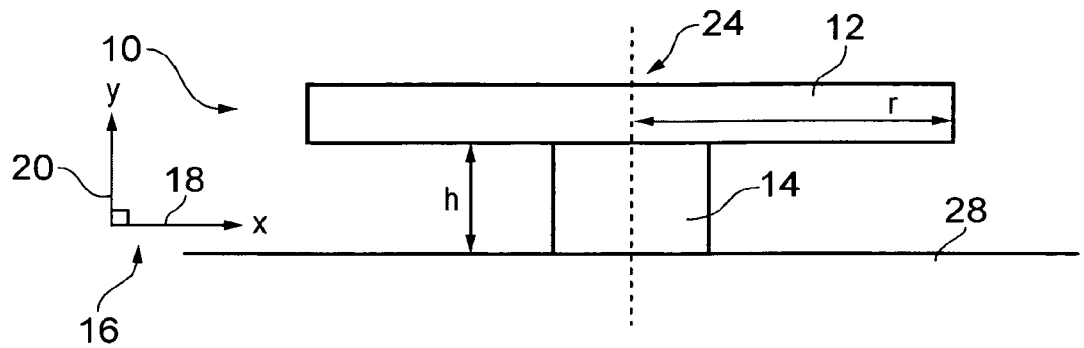
FIG. 1 illustrates a side view of a resonator according to various embodiments of the invention.
Figure 2:
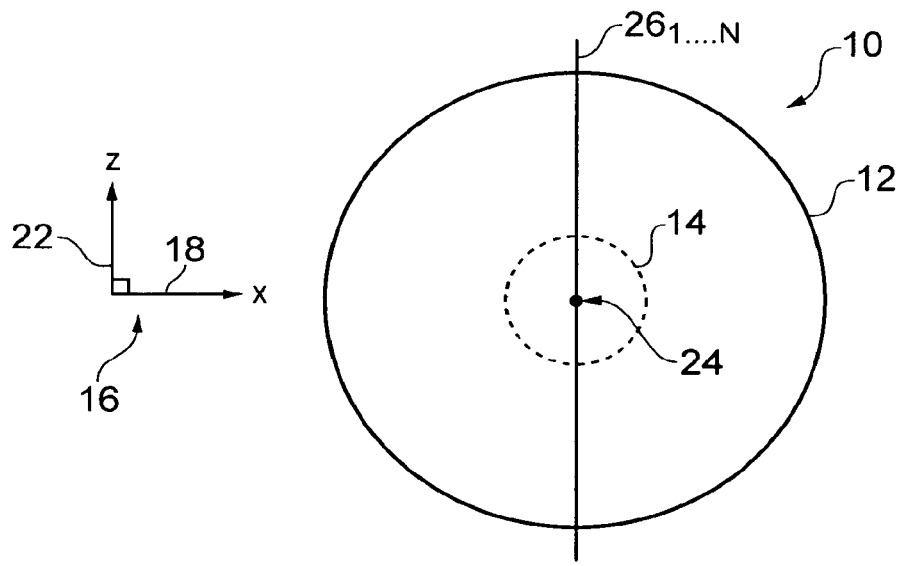
FIG. 2 illustrates a plan view of the resonator illustrated in FIG. 1.
Figure 3:
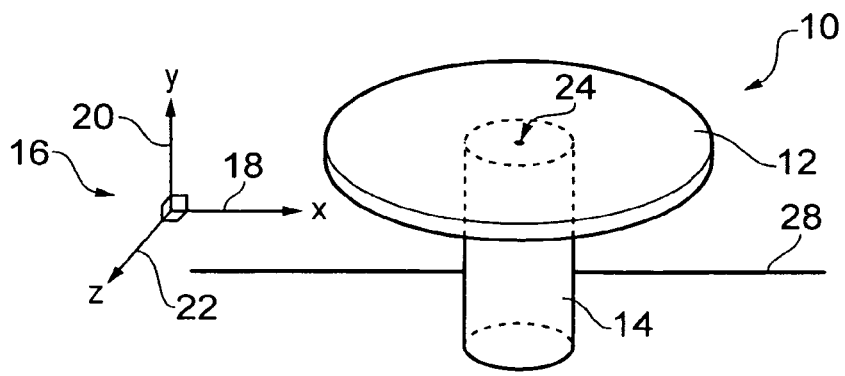
FIG. 3 illustrates a perspective view of the resonator illustrated in FIG. 1 and in FIG. 2.

FIGS. 1, 2 and 3 illustrate a resonator 10 comprising: a substantially disk shaped portion 12 having a plurality of axes of symmetry $26_{1 \ldots N}$ and configured to resonate in a plurality of resonant modes by symmetrically deforming about the plurality of axes of symmetry $26_{1 \ldots N}$.

In the following description, the wording 'connect' and 'couple' and their derivatives mean operationally connected/coupled. It should be appreciated that any number or combination of intervening components can exist (including no intervening components).

In more detail, FIG. 1 illustrates a side view of a resonator 10 according to various embodiments of the invention. The resonator 10 includes a first portion 12 and a second portion 14. The first portion 12 is configured to resonate and the second portion 14 is configured to support the first portion 12. The resonator 10 may be a micro-electro-mechanical system (MEMS) or a nano-electro-mechanical system (NEMS). The resonator 10 may include any suitable material and may include Silicon for example.

FIGS. 1, 2 and 3 also illustrate a Cartesian co-ordinate system 16 that includes an x axis 18, a y axis 20 and a z axis 22. The x axis 18, the y axis 20 and the z axis 22 are orthogonal to one another.

The first portion 12 is substantially disk shaped with a circular cross section that lies in the x-z plane and a depth (d) that extends in the direction of the y axis. The first portion 12 has a centre 24 and a radius (r) that may be, for example, 0.1 micrometers to 100 micrometers. The depth (d) of the first portion 12 may be, for example, 0.01 micrometers to 10 micrometers The first portion 12 has a large (substantially infinite) number of axes of reflective symmetry $26_1$ to $26_N$.

The second portion 14 of the resonator 10 is substantially cylindrical and is connected to a substrate 28 (such as a printed circuit board (PCB)) that lies in the x-z plane and to the first portion 12. Consequently, the second portion 14 supports the first portion 12 on the substrate 28 and the resonator 10 has a mushroom shape. The second portion 14 extends in the +y direction from the substrate 28 and has a height (h) of, for example, 0.1 micrometers to 100 micrometers. In various embodiments, the second portion 14 is connected to the first portion 12 at the centre 24 of the first portion 12. The second portion 14 may comprise any suitable material and may comprise Silicon for example.

The first portion 12 is relatively fixed at the centre 24 due to the connection with the second portion 14. However, the first portion 12 is able to deform about the centre 24 in the x axis 18, y axis 20 and y axis 22 directions when a force is applied to the first portion 12. The deformation of the first portion 12 can be viewed as bending of at least a part of the first portion 12 in any one or more of the x axis 18, the y axis 20 and the z axis 22.

FIGS. 4A, 4B, 5A and 5B illustrate plan views of the resonator 10 and deformation of the disk shaped portion 12 in a first, second, third and fourth resonant mode respectively. Each of the resonant modes is defined by the orientation of the axis about which the first portion 12 is symmetrically deformed. The resonant modes may also be referred to as the spatial phase of the resonator 10. The first portion 12 may be considered as symmetrically deformed when the bending of the first portion 12 is substantially the same either side of the axis (that is, the deformation of the first portion 12 on one side of the axis is substantially mirrored on the other side of the axis).

The shading on the disk shaped portion 12 indicates the magnitude of deformation in the y axis 20 illustrated in FIGS. 1, 2 and 3. Light shading indicates that the magnitude of deformation of the disk shaped portion 12 is relatively low. Dark shading indicates that the magnitude of deformation of the disk shaped portion 12 is relatively high.

A plurality of electrodes 30 are positioned around the perimeter of the disk shaped portion 12 and receive an alternating current (AC). In these embodiments, the resonator 10 is electrically charged and the alternating current in the electrodes 30 causes an electrostatic force between the electrodes and the disk shaped portion 12. Since each electrode 30 may receive a different alternating current, the electrostatic force between each electrode 30 and the disk shaped portion 12 may be different. Consequently, the overall electrostatic force on the disk shaped portion 12 is a superposition of the electrostatic forces between each electrode 30 and the disk shaped portion 12. The electrostatic force from each of the electrodes 30 on the disk shaped portion 12 deforms the disk shaped portion 12 so that the larger the electrostatic force, the greater the magnitude of deformation. When the frequency of the signal at the electrodes 30 is substantially the same as the resonant frequency of the disk shaped portion 12, the signal at the electrodes 30 causes the disk shaped portion 12 to resonate at the resonant frequency.

In the following description with reference to FIGS. 4A, 4B, 5A and 5B, the deformation of the disk shaped portion 12 is described with reference to a number of angular degrees around the disk shaped portion 12. It should be appreciated that this discussion is provided to aid understanding of the figures and it should be understood that such positions are not labeled on the resonator 10.

In FIGS. 4A, 4B, 5A and 5B the electrodes 30 are positioned around the perimeter of the disk shaped portion 12 so that a first electrode $30_1$ is positioned between a zero degree position and a ninety degree position, a second electrode $30_2$ is positioned between the ninety degree position and a one hundred and eighty degree position, a third electrode $30_3$ is positioned between the one hundred and eighty degree position and a two hundred and seventy degree position, and a fourth electrode $30_4$ is positioned between the two hundred and seventy degree position and the zero degree position.

In more detail, FIG. 4A illustrates a first resonant mode where the disk shaped portion 12 is deformed such that it has an elliptical cross section. The major axis 32 of the portion 12 extends between the zero degree position and the one hundred and eighty degree position and the minor axis of the portion 12 extends between the ninety degree position and the two hundred and seventy degree position. FIG. 4A also illustrates areas that have dark shading (indicating relatively large deformation) around the inside of the perimeter of the portion 12 at the zero degree position, the ninety degree position, the one hundred and eighty degree position and the two hundred and seventy degree position. Consequently, the first portion 12 is symmetrical deformed about the major axis 32.

FIG. 4B illustrates a second resonant mode where the disk shaped portion 12 is deformed such that it has an elliptical cross section. The second resonant mode is similar to the first resonant mode, but differs in that the axis of symmetry of deformation has been rotated within the x-z plane. The major axis of the portion 12 now extends between a one hundred and thirty five degree position and a three hundred and fifteen degree position and the minor axis of the portion 12 extends between the two hundred and twenty five degree position and the forty five degree position. FIG. 4B also illustrates areas that have dark shading (indicating relatively large deformation) around the perimeter of the portion 12 at the one hundred and thirty five degree position, the two hundred and twenty five degree position, the three hundred and fifteen degree position and the forty five degree position. Consequently, the first portion 12 is symmetrically deformed about the major axis 32.

The first resonant mode illustrated in FIG. 4A has substantially the same frequency as the second resonant mode illustrated in FIG. 4B. For example, the resonant frequency of the first and second resonant modes may be 6 MHz. However, the major axis 32 of the first portion 12 when in the first resonant mode has a different orientation to the major axis 32 of the first portion 12 when in the second resonant mode. Consequently, the orientation of the axis of symmetry of deformation defines the resonant mode (and spatial phase).

FIG. 5A illustrates a third resonant mode where the disk shaped portion 12 is deformed so that it has a triangular cross section (where each corner of the triangular shape is curved). The major axis of the portion 12 extends between the forty five degree position and the two hundred and twenty five degree position. FIG. 5A also illustrates areas that have dark shading (indicating relatively large deformation) around the perimeter of the portion 12 at the forty five degree position, the one hundred and five degree position, the one hundred and sixty five degree position, the two hundred and twenty five degree position, the two hundred and eighty five degree position and the three hundred and forty five degree position. Consequently, the first portion 12 is symmetrically deformed about the major axis 32.

FIG. 5B illustrates a fourth resonant mode where the disk shaped portion 12 is deformed such that it has a triangular cross section (where each corner of the triangular shape is curved). The fourth resonant mode is similar to the third resonant mode, but differs in that the axis of symmetry of deformation has been rotated within the x-z plane. The major axis of the portion 12 extends between one hundred and thirty five degree position and the three hundred and fifteen degree position. FIG. 5B also illustrates areas that have dark shading (indicating relatively large deformation) around the inside of the perimeter of the portion 12 at the one hundred and thirty five degree position, the one hundred and ninety five degree position, the two hundred and fifty five degree position, the three hundred and fifteen degree position, fifteen degree position and the seventy five degree position. Consequently, the first portion 12 is symmetrically deformed about the major axis 32.

The third resonant mode illustrated in FIG. 5A has substantially the same frequency as the fourth resonant mode illustrated in FIG. 5B. For example, the resonant frequency of the third and fourth resonant modes may be 11 MHz. However, the major axis 32 of the first portion 12 when in the third resonant mode has a different orientation to the major axis 32 of the first portion 12 when in the fourth resonant mode. Consequently, the orientation of the axis of symmetry of deformation defines the resonant mode (and spatial phase).

The resonant modes of the disk shaped portion 12 have a fundamental resonant frequency and may also have resonant frequencies that are integer multiples of the fundamental resonant frequency. For example, where the fundamental resonant frequency is denoted by the symbol f, the disk shaped portion 12 may also be resonant at frequencies $n*f$, where n is any integer.

The disk shaped portion 12 may have a large (substantially infinite) number of resonant modes (spatial phases) due to the large (substantially infinite) number of axis of reflective symmetry. Consequently, it should be appreciated that the resonant modes described above are provided as examples and that the disk shaped portion 12 is not limited to these examples.

Embodiments of the present invention may provide several advantages. For example, the large (substantially infinite) number of resonant modes may significantly increase the number of functions that a resonator (and a resonator array) may provide for signal processing. Furthermore, the resonator 10 resonates relatively efficiently since the second portion 14 is connected to the first portion 12 at a node and little to no energy is transferred to the second portion 14.

Figure 6:
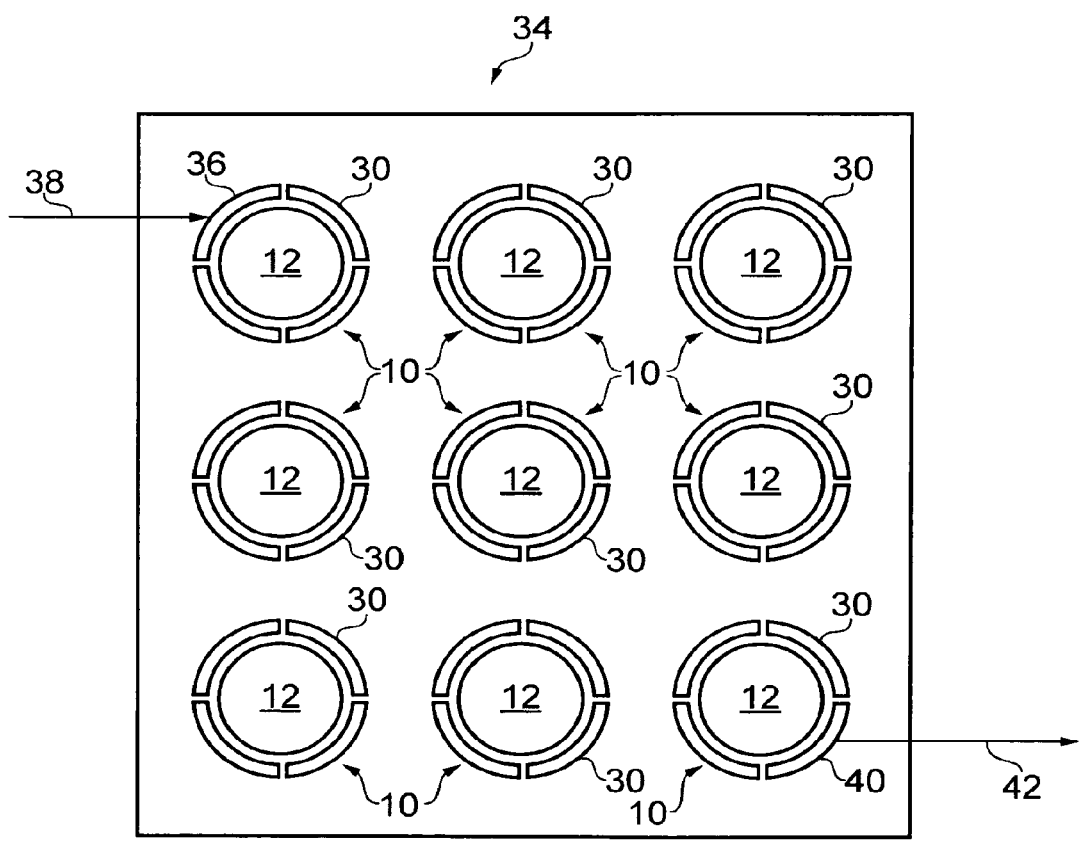
FIG. 6 illustrates a plan view of a resonator array according to various embodiments of the invention.

FIG. 6 illustrates a schematic plan view of a resonator array 34 according to various embodiments of the present invention. The resonator array 34 includes a three by three array of resonators 10 as illustrated in FIGS. 1, 2, 3, 4A, 4B, 5A and 5B. It should be appreciated that in other embodiments, a resonator array 34 may include any number of resonators 10 in any arrangement. The resonator array 34 may be a module that may be incorporated into an apparatus such as a mobile cellular telephone. As used here 'module' refers to a unit or apparatus that excludes certain parts/components that would be added by an end manufacturer or a user.

The resonator array 34 includes a plurality of electrodes 30 that are provided around the perimeter of each of the disk shaped portions 12 as illustrated and described with reference to FIGS. 4A, 4B, 5A, 5B. The plurality of electrodes 30 include an input electrode 36 that is configured to receive an input signal 38. The input electrode 36 is located in the top left corner of the array of resonators 34. The plurality of electrodes 30 also include an output electrode 40 that is configured to provide an output signal 42. The output electrode 40 is located in the bottom right corner of the array of resonators 34.

The resonant frequency band of the resonator array 34 is dependent on the resonant frequencies of the resonators 10 in the array 34, the quality factor of the resonators 10 and the strength of capacitive coupling between the resonators 10 and the electrodes 30.

In operation, an alternating current input signal 38 is provided to the input electrode 36. The input electrode 36 capacitively couples with at least a subset of the plurality of electrodes 30 positioned around the plurality of resonators 10. When the input signal has a frequency that is substantially the same as the fundamental frequency (or an integer multiple of the fundamental frequency) of a resonant mode of the disk shaped portions 12, the alternating current in the electrodes 30 causes the disk shaped portions 12 to resonate. Since the resonators 10 are charged, the input signal 38 is transmitted (via capacitive coupling) across the resonator array 34 by the resonators 10 and the electrodes 30 to the output electrode 40 which provides an output signal 42.

Figure 7:
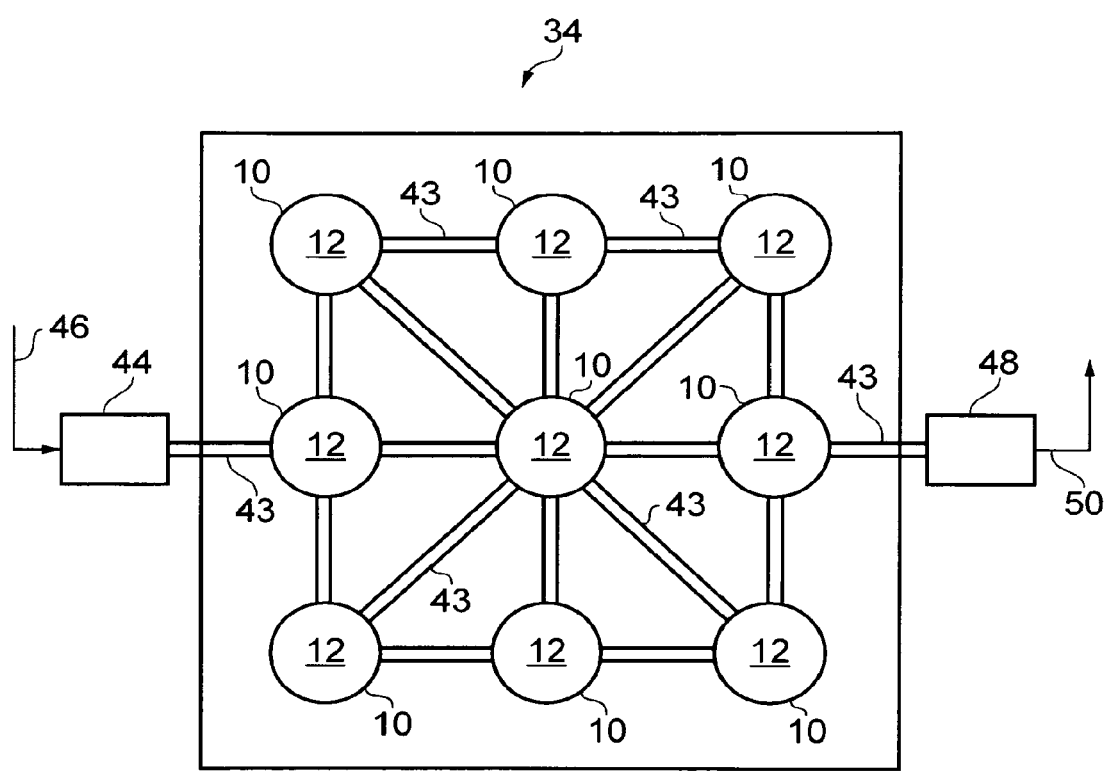
FIG. 7 illustrates a plan view of a resonator array according to various embodiments of the invention.

FIG. 7 illustrates a schematic plan view of a resonator array 34 according to various embodiments of the present invention. The resonator array 34 includes a three by three array of resonators 10 as illustrated in FIGS. 1, 2, 3, 4A, 4B, 5A and 5B. It should be appreciated that in other embodiments, a resonator array 34 may include any number of resonators 10 in any arrangement. The resonator array 34 may be a module that may be incorporated into an apparatus such as a mobile cellular telephone. As used here 'module' refers to a unit or apparatus that excludes certain parts/components that would be added by an end manufacturer or a user.

The resonator array 34 includes a plurality of connectors 43 that physically interconnect neighboring disk shaped portions 12 to one another. The plurality of connectors 43 may be wires or rigid bars. An input transducer 44 is provided at one side of the perimeter of the resonator array 34 and is configured to receive an input signal 46. The input transducer 44 is configured to convert the input signal 46 into a mechanical vibration. The input transducer 44 is physically connected to one of the resonators 10 via a connector 43 (and may be connected to more than one resonator 10 in other embodiments). An output transducer 48 is provided at the opposite side of the perimeter of the resonator array 34 and is configured to convert the mechanical vibration of the resonator array 34 into an output signal 50. The output transducer 48 is physically connected to one of the resonators 10 via a connector 43 (and may be connected to more than one resonator 10 in other embodiments). The transducers 44, 48 may comprise any suitable material and may comprise a piezoelectric material for example.

The resonant frequency band of the resonator array 34 is dependent on the resonant frequencies of the resonators 10 in the array 34, the quality factor of the resonators 10 and the strength of physical coupling between the resonators 10 via the connectors 43.

In operation, an alternating current input signal 46 is provided to the input transducer 36. The input transducer 43 physically deforms in response to the input signal 46 and provides a force to the resonator 10 via the connector 43. When the input signal 46 has a frequency that is substantially the same as the fundamental frequency (or an integer multiple of the fundamental frequency) of a resonant mode of the disk shaped portions 12, the force provided by the input transducer 44 causes the disk shaped portions 12 to resonate. Since the resonators 10 are connected to one another via the connectors 43, the input signal 46 is transmitted across the resonator array 34 by the resonators 10 and the connectors 43. The output transducer 48 receives a force from the connector 43 that connects the output transducer 48 with the resonator 10 and physically deforms and thereby provides an output signal 42.

It should be appreciated that a resonator array 34 may include both electrodes 30 and connectors 43 in other embodiments. For example, a subset of neighboring resonators 10 may be electrostatically coupled to one another via a plurality of electrodes 30 and another subset of neighboring resonators 10 may be physically connected to one another via connectors 43.

Embodiments of the present invention may provide several advantages. One such advantage is that the resonators 10 are able to receive an input force from substantially any direction and resonate due to the large (substantially infinite) number of resonant modes (spatial phases). This may facilitate the design of the resonators 10 within the resonator array 34, the positioning of the input/output electrodes 36, 40 and the orientations of the connectors 43 between the input/output transducers 44, 48 and the resonators 10 since the relative positioning of the resonators 10 in the array does not substantially affect the ability of the resonator array 34 to resonate. Consequently, the resonator array 34 may be relatively simple and inexpensive to manufacture.

Figure 8:
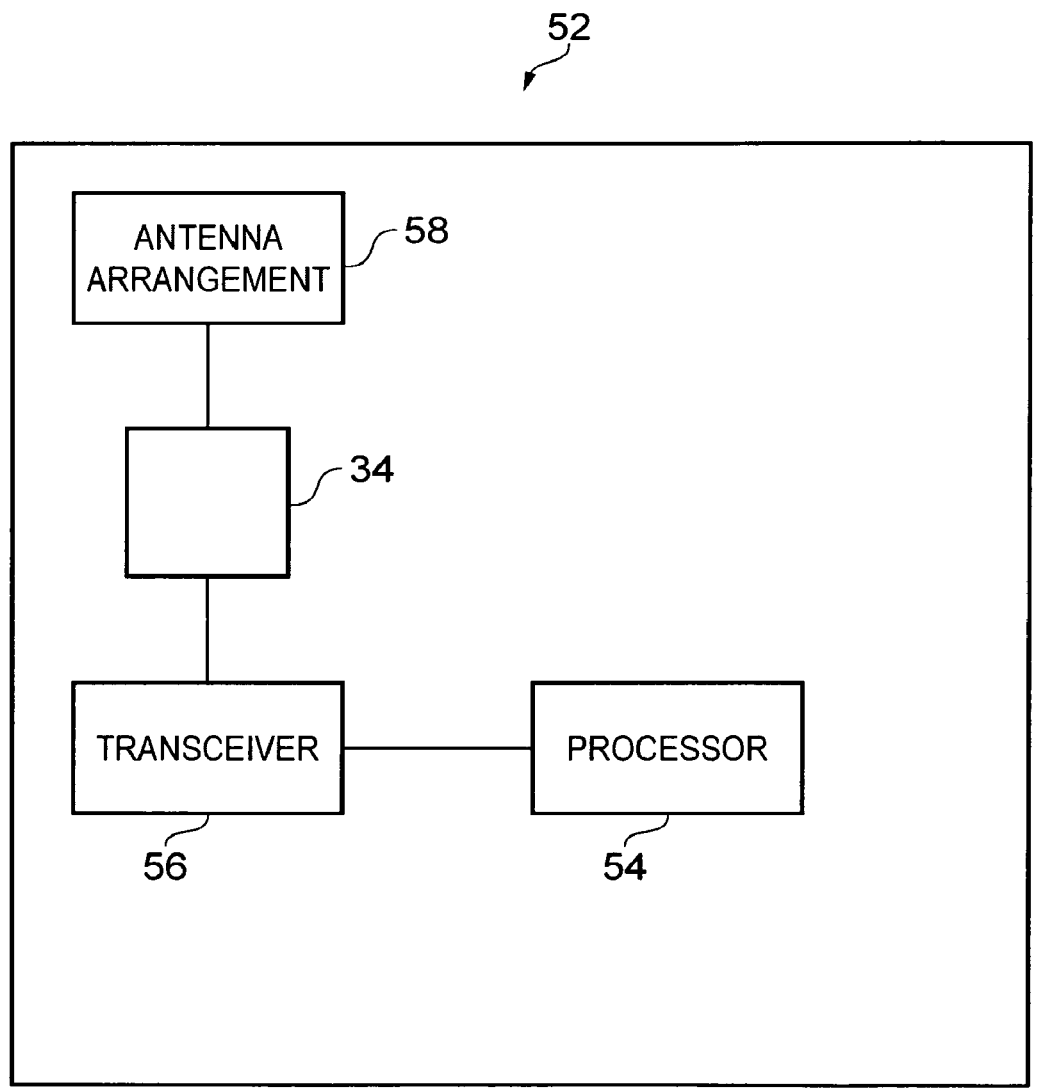
FIG. 8 illustrates a schematic diagram of an apparatus including a resonator array according to various embodiments of the invention.

FIG. 8 illustrates a schematic diagram of an apparatus 52 according to various embodiments of the invention. The apparatus 52 may be any electronic device and may be a portable device such as a mobile cellular telephone. The apparatus 52 includes a processor 54, a transceiver 56, a resonator array 34 and an antenna arrangement 58. The apparatus 10 may include other circuitry such as a user input device, a memory and an audio output device.

The processor 54 may be any suitable processor and may be an Application Specific Integrated Circuit (ASIC) or a microprocessor. The processor 54 is configured to provide a signal to the transceiver 56. The transceiver 56 is configured to encode the signal and provide the encoded signal to the antenna arrangement 58 via the resonator array 34 for transmission. The antenna arrangement 58 may be configured to receive a signal and provide the signal to the transceiver 56 via the resonator array 34. The transceiver 56 is configured to decode the signal and provide the decoded signal to the processor 54 for processing.

In this embodiment, the resonator array 34 provides a band-pass filter function and prevents the flow of signals therethrough that have a frequency outside of a particular frequency band (US—Global system for mobile communications (US-GSM) 850 (824-894 MHz) for example). As described above, the resonator array 34 is configured to resonate in a particular frequency band. If the input signal has a frequency within that particular frequency band, the input signal may flow across the resonator array 34. If the input signal has a frequency that is not within that particular frequency band, the input signal may be substantially prevented from flowing across the resonator array 34.

In various embodiments, the apparatus 52 may include a plurality of resonator arrays 34 that are arranged in parallel between the antenna arrangement 58 and the transceiver 56. In these embodiments, the resonator arrays 34 may provide a plurality of band-pass filters for different frequency bands. In other embodiments, the plurality of resonators arrays 34 may be provided as a single, discrete unit, having multiple inputs and multiple outputs.

It should be appreciated that a resonator array 34 according to various embodiments of the invention may be used in other signal processing applications. For example, the resonator 34 may be used for image recognition.

Figure 9:
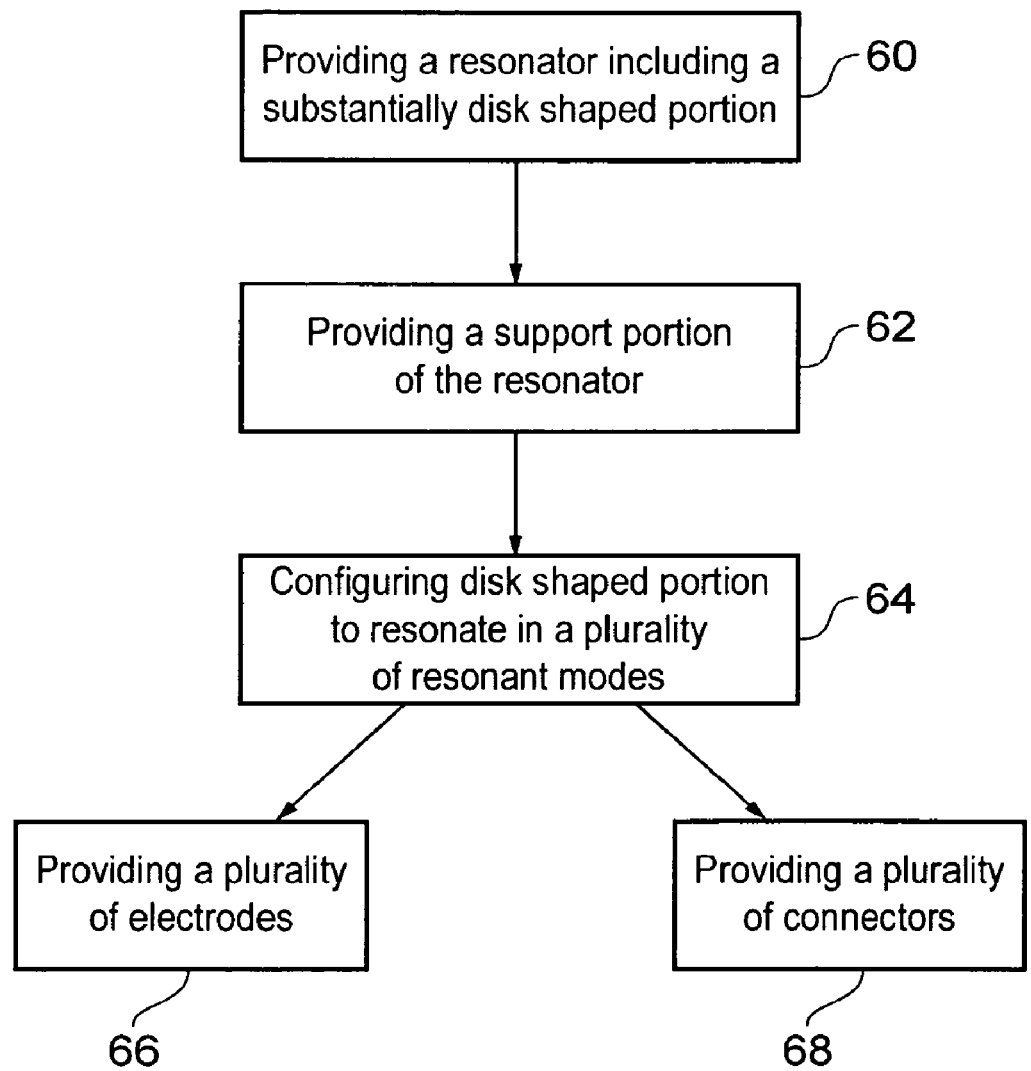
FIG. 9 illustrates a flow diagram for a method of manufacturing a resonator array according to various embodiments of the invention.

FIG. 9 illustrates a flow diagram of a method for manufacturing a resonator array 34 according to various embodiments of the invention. It should be appreciated that the illustration of a particular order to the blocks does not necessarily imply that there is a required or preferred order for the blocks and the order and arrangement of the block may be varied. Additionally, two or more of the blocks may be performed substantially simultaneously.

Furthermore, it may be possible for some steps to be omitted. In block 60, the method includes providing the resonator 10 including the substantially disk shaped portion 12. In block 62, the method includes providing the support portion 14 of the resonator 10. In block 64, the method includes configuring the disk shaped portion 12 to resonate in a plurality of resonant modes. The disk shaped portion 12 may be configured by forming the portion 12 to have particular dimensions that will resonate in particular resonant modes and frequencies. The method may then move to block 66 in which the plurality of electrodes 30 are provided. Alternatively, the method may move to block 68 in which the plurality of connectors 43 are provided. The method then moves to block 60 and is repeated until a desired number of resonators 10 have been provided.

In one method of forming a resonator array 34, a resonator 10 may be formed using 'bulk micromachining'. In this method, a substrate of silicon is provided and 'notching' is performed on the substrate of silicon to carve out the resonator 10. The 'notching' may be performed using 'Deep-Reactive-Ion-Etching' (DRIE). In this method, the disk shaped portion 12 may be provided and configured to resonate in a plurality of resonant modes at substantially the same time. Consequently, block 62 may be performed after block 64.

In another method of forming a resonator array 34, a resonator 10 may be formed using 'surface micromachining'. In this method, layers of polysilicon are deposited on a substrate one after the other to form the resonator 10. In this method, the second portion 14 is formed prior to the first portion 12 and consequently, block 62 is performed prior to block 60.

Although embodiments of the present invention have been described in the preceding paragraphs with reference to various examples, it should be appreciated that modifications to the examples given can be made without departing from the scope of the invention as claimed. For example, the disk shaped portion 12 may have a different shape to the one described above. The disk shaped portion 12 may include two concave surfaces, two convex surfaces or one concave surface and one convex surface. The disk shaped portion 12 may include two or more parts (e.g. sectors of a circle) that are connected to the second portion 14 and are physically separated from one another. The disk shaped portion 12 may not have a circular cross section but may have a polygonal cross section that has five of more sides (and consequently, five or more axis of reflective symmetry). Alternatively, the disk shaped portion 12 may have an elliptical cross section that has a plurality of axes of reflective symmetry.

In other embodiments, a resonator array 34 may include one or more capacitive transducers (two flexible conductive plates and a dielectric fluid therebetween) for coupling at least a subset of the resonators 10. Capacitive transducers are well known in the art of electronics and will not be discussed in detail here.

Features described in the preceding description may be used in combinations other than the combinations explicitly described.

Although functions have been described with reference to certain features, those functions may be performable by other features whether described or not.

Although features have been described with reference to certain embodiments, those features may also be present in other embodiments whether described or not.

Whilst endeavoring in the foregoing specification to draw attention to those features of the invention believed to be of particular importance it should be understood that the Applicant claims protection in respect of any patentable feature or combination of features hereinbefore referred to and/or shown in the drawings whether or not particular emphasis has been placed thereon.

We claim:

1. A resonator comprising:
a substantially disk shaped portion having a plurality of axes of symmetry and configured to resonate in a plurality of resonant modes by symmetrically deforming about the plurality of axes of symmetry; and
a plurality of electrodes positioned around a perimeter of the disk shaped portion and configured to receive an alternating current.

2. A resonator as claimed in claim 1, wherein each of the plurality of resonant modes has a different orientation.

3. A resonator as claimed in claim 1, wherein the disk shaped portion has a volume that is substantially constant during resonance.

4. A resonator as claimed in claim 1, wherein the disk shaped portion is configured to resonate at a first frequency and at least one integer multiple of the first frequency.

5. A resonator as claimed in claim 1, further comprising a support portion configured to support the disk shaped portion.

6. A resonator as claimed in claim 5, wherein the support portion is connected to the center of the disk shaped portion at the intersection of the plurality of axes of symmetry.

7. A resonator as claimed in claim 1, wherein the resonator is a micro-electro-mechanical system.

8. A resonator as claimed in claim 1, wherein the resonator is a nano-electro-mechanical system.

9. A resonator array comprising a plurality of resonators as claimed in claim 1.

10. A resonator array as claimed in claim 9, wherein at least a subset of neighboring resonators of the plurality of resonators are electrostatically coupled to one another via a plurality of electrodes.

11. A resonator array as claimed in claim 9, wherein at least a subset of neighboring resonators of the plurality of resonators are physically connected to one another via connectors.

12. A method comprising:
providing a resonator array comprising a plurality of resonators as claimed in claim 1.

13. A method as claimed in claim 12, further comprising providing a plurality of electrodes to electrostatically couple at least a subset of neighboring resonators of the plurality of resonators.

14. A method as claimed in claim 12, further comprising providing a plurality of connectors to physically connect at least a subset of neighboring resonators of the plurality of resonators.

15. A method comprising:
providing a resonator including a substantially disk shaped portion having a plurality of axes of symmetry;
configuring the disk shaped portion to resonate in a plurality of resonant modes by symmetrically deforming about the plurality of axes of symmetry; and
providing a plurality of electrodes positioned around a perimeter of the disk shaped portion and configured to receive an alternating current.

16. A method as claimed in claim 15, wherein each of the plurality of resonant modes has a different orientation.

17. A method as claimed in claim 15, wherein the disk shaped portion has a volume that is substantially constant during resonance.

18. A method as claimed in claim 15, further comprising configuring the disk shaped portion to resonate at a first frequency and at least one integer multiple of the first frequency.

19. A method as claimed in claim 15, further comprising providing a support portion of the resonator configured to support the disk shaped portion.

20. A method as claimed in claim 19, wherein the support portion is connected to the center of the disk shaped portion at the intersection of the plurality of axes of symmetry.

21. A method as claimed in claim 15, wherein the resonator is a micro-electro-mechanical system.

22. A method as claimed in claim 15, wherein the resonator is a nano-electro-mechanical system.

* * * * *